United States Patent
Wu

(10) Patent No.: US 11,022,280 B2
(45) Date of Patent: Jun. 1, 2021

(54) LINKAGE MODULARIZED LED DISPLAY MODULE

(71) Applicant: Shenzhen Chip Optech Co. Ltd., Shenzhen (CN)

(72) Inventor: XiaoGang Wu, Shenzhen (CN)

(73) Assignee: Shenzhen Chip Optech Co. Ltd., Shenzhen (CN)

( * ) Notice: Subject to any disclaimer, the term of this patent is extended or adjusted under 35 U.S.C. 154(b) by 69 days.

(21) Appl. No.: 16/447,541

(22) Filed: Jun. 20, 2019

(65) Prior Publication Data

US 2020/0182439 A1  Jun. 11, 2020

(30) Foreign Application Priority Data

Dec. 11, 2018 (CN) .......................... 201811507727.3

(51) Int. Cl.
| | |
|---|---|
| F21V 19/00 | (2006.01) |
| F21K 9/235 | (2016.01) |
| F21V 19/02 | (2006.01) |
| F21V 21/26 | (2006.01) |
| F21Y 115/10 | (2016.01) |
| F21V 29/87 | (2015.01) |
| F21V 21/14 | (2006.01) |
| H01L 33/64 | (2010.01) |
| H05K 1/02 | (2006.01) |
| F21S 2/00 | (2016.01) |
| H01L 23/367 | (2006.01) |
| F21V 29/85 | (2015.01) |
| F21V 29/83 | (2015.01) |

(52) U.S. Cl.
CPC ............ *F21V 19/003* (2013.01); *F21K 9/235* (2016.08); *F21V 19/02* (2013.01); *F21V 21/26* (2013.01); *F21S 2/005* (2013.01); *F21V 19/0055* (2013.01); *F21V 21/14* (2013.01); *F21V 29/83* (2015.01); *F21V 29/85* (2015.01); *F21V 29/87* (2015.01); *F21Y 2115/10* (2016.08); *H01L 23/3677* (2013.01); *H01L 33/64* (2013.01); *H05K 1/0204* (2013.01)

(58) Field of Classification Search
CPC .......... F21V 29/83; F21V 29/85; F21V 29/87; F21V 29/89; F21V 19/02; F21V 21/005; H01L 33/64–648; H01L 23/427; H01L 23/3677; G02F 1/13336; F21S 2/005
See application file for complete search history.

(56) References Cited

U.S. PATENT DOCUMENTS

| | | | |
|---|---|---|---|
| 9,234,652 B2 * | 1/2016 | Wu ........................... G09F 9/33 |
| 10,713,979 B2 * | 7/2020 | Cai ........................ F16M 11/00 |
| 2008/0211370 A1 * | 9/2008 | Sun ........................ F21V 29/89 313/45 |

(Continued)

*Primary Examiner* — Alexander K Garlen
*Assistant Examiner* — Colin J Cattanach
(74) *Attorney, Agent, or Firm* — Novoclaims Patent Services LLC; Mei Lin Wong

(57) ABSTRACT

The present invention relates to a linkage modularized LED display module including linkage lock unit. The said linkage lock unit is provided on the back of the bottom shell plate and includes a driving head and multiple linking rods. The driving head can drive the multiple linking rods to work simultaneously, so that the LED display module can be clamped in the assembly frame or different LED modules can be assembled together.

8 Claims, 6 Drawing Sheets

(56) References Cited

U.S. PATENT DOCUMENTS

| | | | | |
|---|---|---|---|---|
| 2009/0290348 A1* | 11/2009 | Van Laanen | ............ | F21V 29/70 |
| | | | | 362/249.02 |
| 2011/0255285 A1* | 10/2011 | Lai | ........................ | F21V 29/507 |
| | | | | 362/249.02 |
| 2012/0300437 A1* | 11/2012 | Lu | ............... | F21S 2/00 |
| | | | | 362/147 |
| 2014/0085864 A1* | 3/2014 | Wu | ........................ | F21V 19/001 |
| | | | | 362/97.1 |
| 2015/0167948 A1* | 6/2015 | Wasserman | ............. | F21S 2/005 |
| | | | | 362/249.01 |
| 2015/0330610 A1* | 11/2015 | Song | ................... | F21V 19/0035 |
| | | | | 362/6 |
| 2017/0167714 A1* | 6/2017 | Hong | .................... | H01L 33/642 |
| 2018/0024802 A1* | 1/2018 | Patterson | .............. | G06F 3/1446 |
| | | | | 29/434 |
| 2019/0032868 A1* | 1/2019 | Jiang | ................... | F21V 19/0035 |
| 2020/0201590 A1* | 6/2020 | Lim | ........................ | G06F 1/1601 |

* cited by examiner

LINKAGE MODULARIZED LED DISPLAY MODULE

BACKGROUND OF THE PRESENT INVENTION

Field of Invention

The present invention relates to a LED display module, especially to a LED display module which is provided with a linkage lock unit on the back. The said linkage lock unit includes a driving head and multiple linking rods. The driving head can drive the multiple linking rods to work simultaneously, so that the LED display module can be clamped in the assembly frame or different LED modules can be assembled.

Description of Related Arts

The LED display screen is a flat panel display which is assembled by multiple LED module panels, and can display dynamic or static signal such as words, images, videos and so on.

FIG. 1 shows a traditional LED display screen which includes multiple LED display modules 1 and assembly frame 2. The multiple LED display modules 1 are respectively installed on the assembly frame 2 to form an integral large LED display screen.

However, the traditional LED display screen has many disadvantages described as follows. Firstly, workers need bolts or fix locks to fix the four edges of the LED display module on the assembly frame 2, the installation is complicated, and the installation efficiency is low. Furthermore, the disassembly manner is also complicated, and it is inconvenient for the disassembly and maintenance. Secondly, because each LED display module has an independent power signal control box, it is need many power wires and signal wires, and the connection is complicated. This is the main disadvantage of the traditional technical solution.

SUMMARY OF THE PRESENT INVENTION

The present invention provides a linkage modularized LED display module including linkage lock unit. The said linkage lock unit is provided on the back of the bottom shell plate and includes a driving head and multiple linking rods. The driving head can drive the multiple linking rods to work simultaneously, so that the LED display module can be clamped in the assembly frame or different LED modules can be assembled together, and this is the main object of the invention.

The present invention provides a linkage modularized LED display module provided with sub-modules on the upside and underside. One LED display module can be assembled with two said sub-modules to form a unit module. An integral LED display screen can be directly formed by assembling multiple of the said unit module. Because the unit module is large than one single LED display module, the assembling efficiency can be greatly improved by the said unit module. This is another object of the invention.

The technical solution of the invention is providing a linkage modularized LED display module 50, which includes a LED lamp plate 10, a face guard board 20 and a bottom shell plate 30. The LED lamp plate 10 is provided with multiple LED light source 11. The face guard board 20 covers one side of the LED lamp plate 10, while the bottom shell plate 30 covers the other side of the lamp plate 10. The multiple LED light source 11 are exposed from the face guard board 20.

The linkage modularized LED display module 50 includes linkage lock unit 100 which is provided on the back of the bottom shell plate 30. The unit 100 includes multiple linking rods 120 and a driving head 110 which is rotatably inserted into the bottom shell plate 30.

The driving head 110 includes a rotating shaft 111, a gear column 112 which can synchronously rotate with the rotating shaft 111 and a driving hole 113 which is provided in the gear column 112. The rotating shaft 111 is connected to the bottom of the gear column 112.

The multiple linking rods 120 are engaged with the gear column 112. Wherein, each linking rod 120 includes a rack 121, a connecting rod 122 and a chuck 123.

The rack 121, connecting rod 122 and chuck 123 are connected together and form an integral structure. Wherein, the rack 121 is engaged with the gear column 112, and the connecting rod 122 connects the rack 121 and the chuck 123, and the chuck is located on the edges of the bottom shell plate 30.

When in work, operator inserts the column spanner into the driving hole 113 and rotates it, then, the driving head 110 drives multiple linking rods to work simultaneously and make every chuck 123 project outwardly, thus the LED display module 50 is clamped in the assembly frame 2 or different LED modules are assembled together.

DETAILED DESCRIPTION OF THE PREFERRED EMBODIMENT

Figure 1:
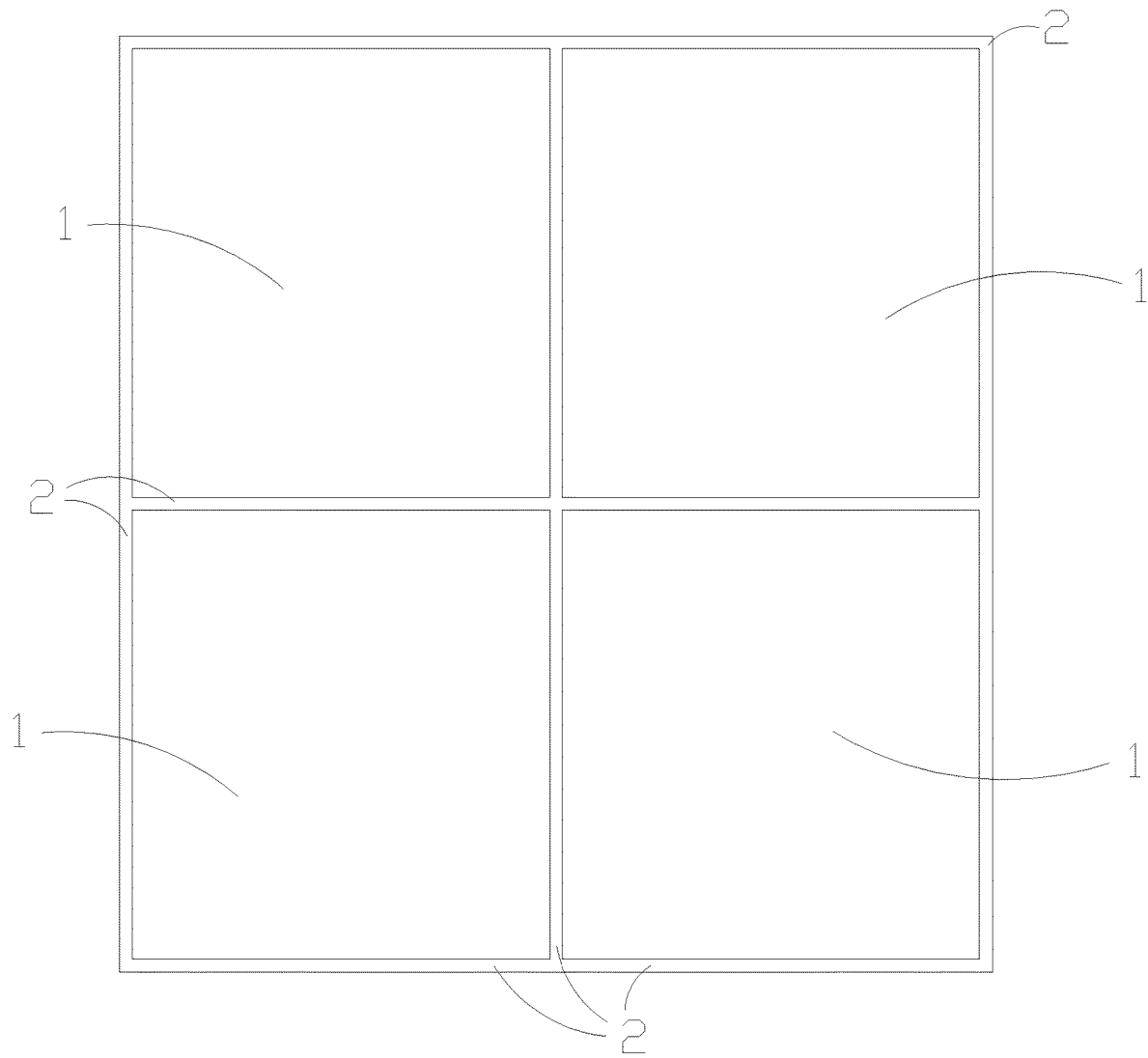
FIG. 1 is a traditional LED display screen.

As shown in FIGS. 2 to 6, a linkage modularized LED display module 50 includes a LED lamp plate 10, a face guard board 20 and a bottom shell plate 30.

The LED lamp plate 10 is provided with multiple LED light source 11.

The face guard board 20 covers one side of the LED lamp plate 10, while the bottom shell plate 30 covers the other side of the lamp plate 10.

The multiple LED light source 11 are exposed from the face guard board 20.

In operation, the multiple LED light sources 11 are switched on and emitting light, then, show images.

Figure 2:
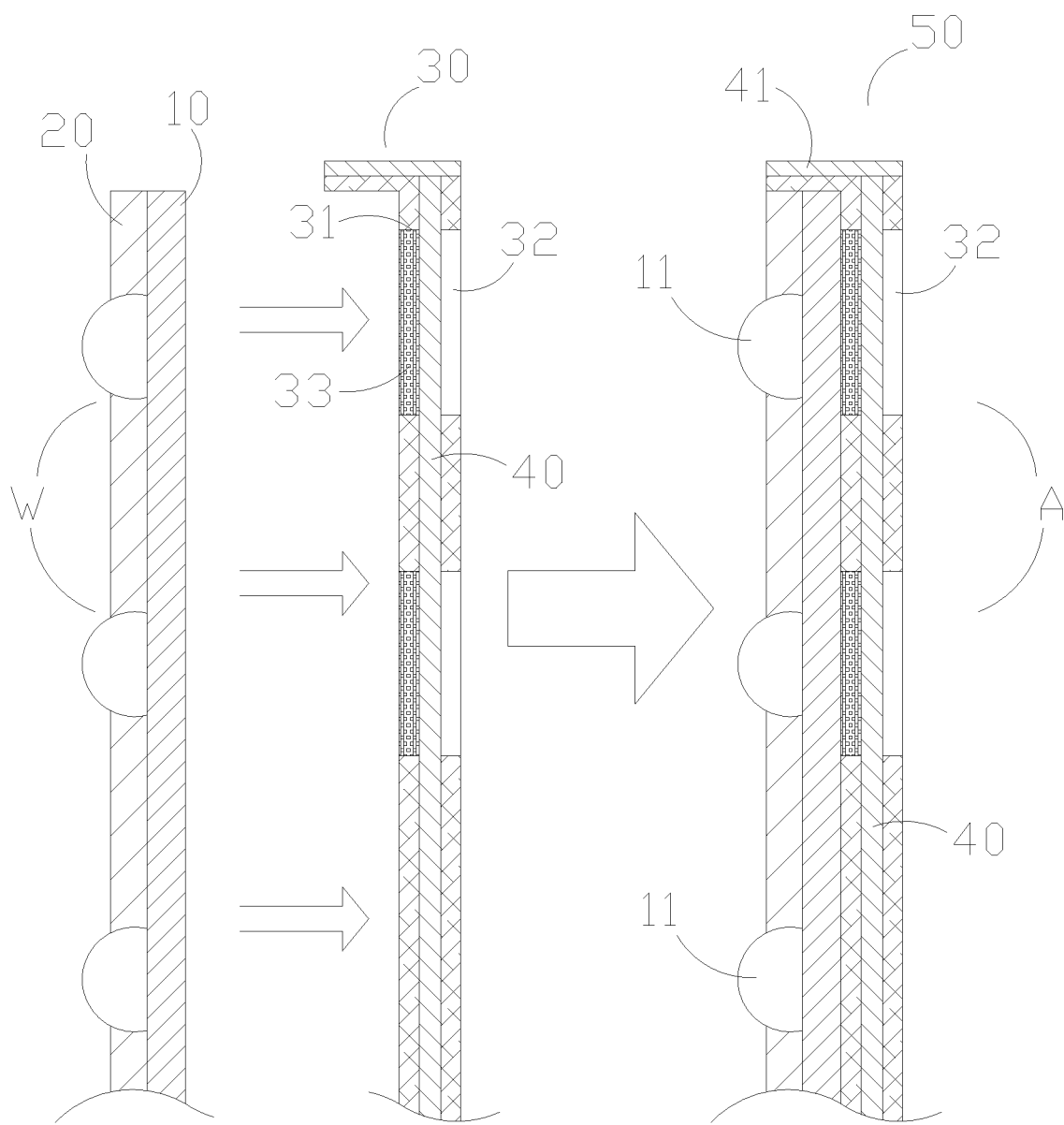
FIG. 2 illustrates the sectional view of the display module of the present invention.

As shown in FIG. 2, in practice, in order to improve resolution of the LED display screen, the distance W between the LED light sources 11 is more and more small, and the LED lamp plate 10 is more and more heated, therefore, a radiating board 40 is embedded in the bottom shell plate 30 of the invention.

The bottom shell plate 30 is provided with an inside heat conducting hole 31 and an outside radiating hole 32. Wherein, the inside heat conducting hole 31 is positioned between the LED lamp plate 10 and the radiating board 40 and filled with heat conducting rubber block 33 which can be made of heat conducting silica gel.

The outside radiating hole 32 communicates the radiating board 40 and the outer space A.

The heat of the LED lamp plate 10 is conducted to the radiating board 40 mainly by the heat conducting rubber block 33, and then radiated to the outer space A mainly by the outside radiating hole 32, so the heat radiate from the LED lamp plate 10.

By the structure said above, the LED lamp plate 10 can radiate heat without any additional radiating element, therefore, the thickness of the LED display module can be greatly reduced and the volume can be reduced.

In an embodiment, the bottom shell plate 30 is provided with a ring frame 41 connected with the radiating board 40.

The ring frame 41 and the radiating board 40 are made of metal, such as aluminium alloy, magnesium alloy and so on.

The face guard board 20 and the bottom shell plate 30 are made of plastic.

The ring frame 41 and the radiating board 40 not only can improve the radiating effect, but also can improve the strength of the structure.

Figure 3:
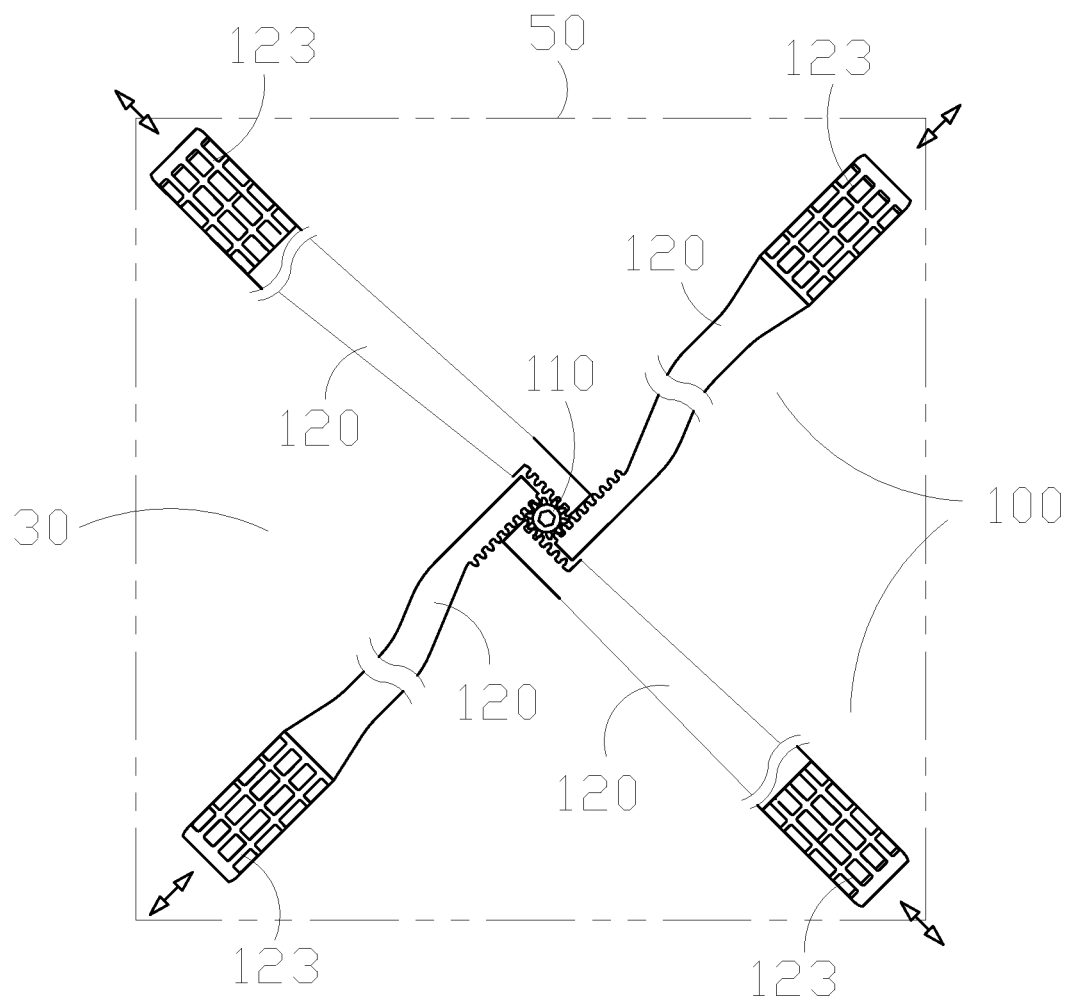
FIG. 3 illustrates the structure of the present invention which has four linking rods.
Figure 4:
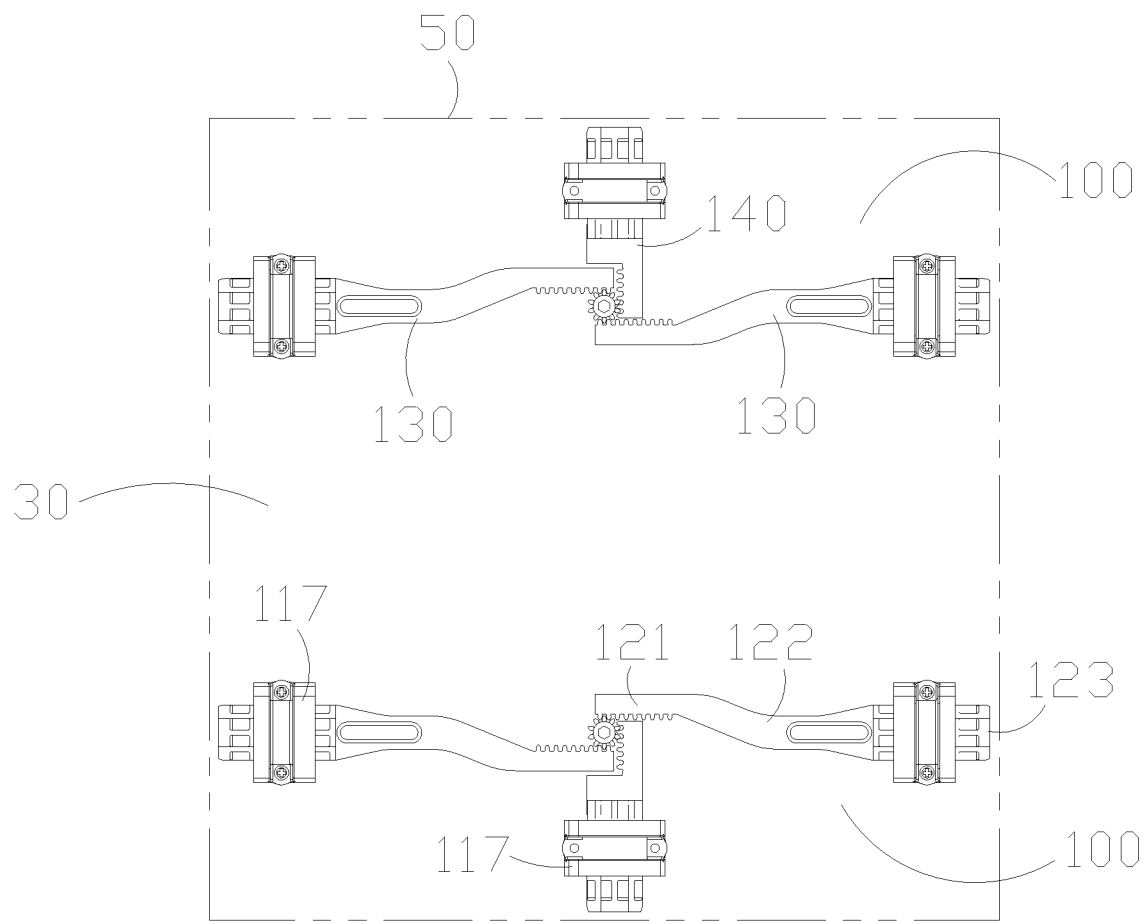
FIG. 4 illustrates the structure of the present invention which has three linking rods.
Figure 5:
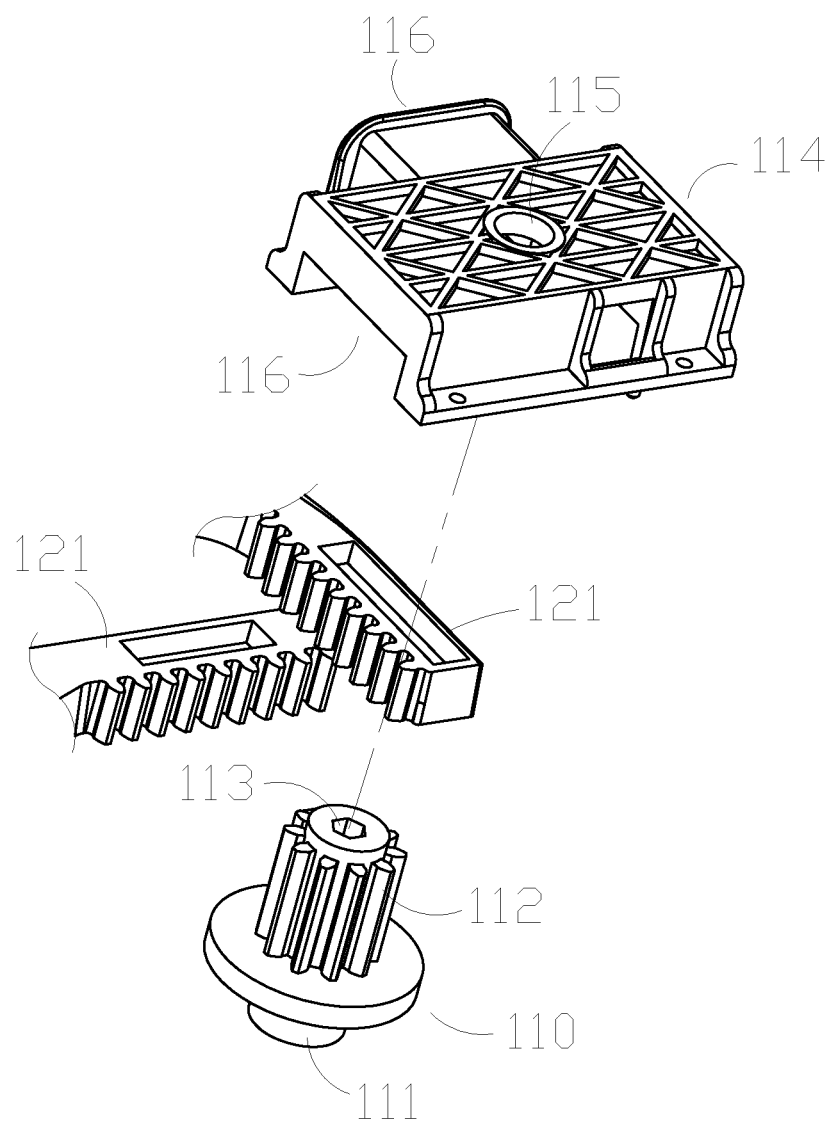
FIG. 5 is a perspective view of the linkage lock unit of the present invention.

As shown in FIGS. 3 to 5, the linkage modularized LED display module 50 includes linkage lock unit 100 which is provided on the back of the bottom shell plate 30.

The linkage lock unit 100 includes multiple linking rods 120 and a driving head 110 which is rotatably inserted into the bottom shell plate 30.

The driving head 110 includes a rotating shaft 111, a gear column 112 and a driving hole 113 The rotating shaft 111 is connected to the bottom of the gear column 112 which can synchronously rotate with the rotating shaft 111

The driving hole 113 is provided in the gear column 112.

The multiple linking rods 120 are engaged with the gear column 112. Wherein, each linking rod 120 includes a rack 121, a connecting rod 122 and a chuck 123.

The rack 121, connecting rod 122 and chuck 123 are connected together and form an integral structure. Wherein, the rack 121 is engaged with the gear column 112, and the connecting rod 122 connects the rack 121 and the chuck 123, and the chuck is located on the edges of the bottom shell plate 30.

When in work, operator inserts the column spanner into the driving hole 113 and rotates it, then, the driving head 110 drives multiple linking rods 120 to work simultaneously and make every chuck 123 project outwardly, thus the LED display module 50 is clamped in the assembly frame 2 or different LED modules are assembled together.

In an embodiment, the driving hole 113 can be an internal hexagonal hole or a rectangular hole.

In an embodiment as shown in FIG. 5, the linkage lock unit 100 further includes a cover 114 which is provided with a rotating hole 115 at the top. The driving head 110 is covered by the cover 114, and the top of the driving head 110 is located in the rotating hole 115. The cover 114 can protect the driving head 110, and can rotatably support the driving head 110 on the back of the bottom shell plate 30. The cover 114 is provided with a through hole 116 on the side face. Multiple linking rods 120 are arranged in the through hole 116 in a penetrating way.

In an embodiment as shown in FIG. 4, the linkage lock unit 100 further includes multiple limiting covers 117 which are fixed on the edges of the back of the bottom shell plate 30.

The chuck 123 of the linking rod 120 penetrates the limiting cover 117. The movement track of the chuck 123 is limited by the limiting cover 117.

As shown in FIG. 3, the linkage lock unit 100 includes a driving head 110 and four linking rods 120. The chucks 123 of the four linking rods 120 are respectively locate at the four corners of the bottom shell plate 30.

Rotation of the driving head 110 can make the four chucks project outwardly, so the LED display module 50 can be clamped in the assembly frame 2.

By the linkage structure said above, the present invention can realize the rapidly installation and disassembly of the LED display module.

Figure 6:
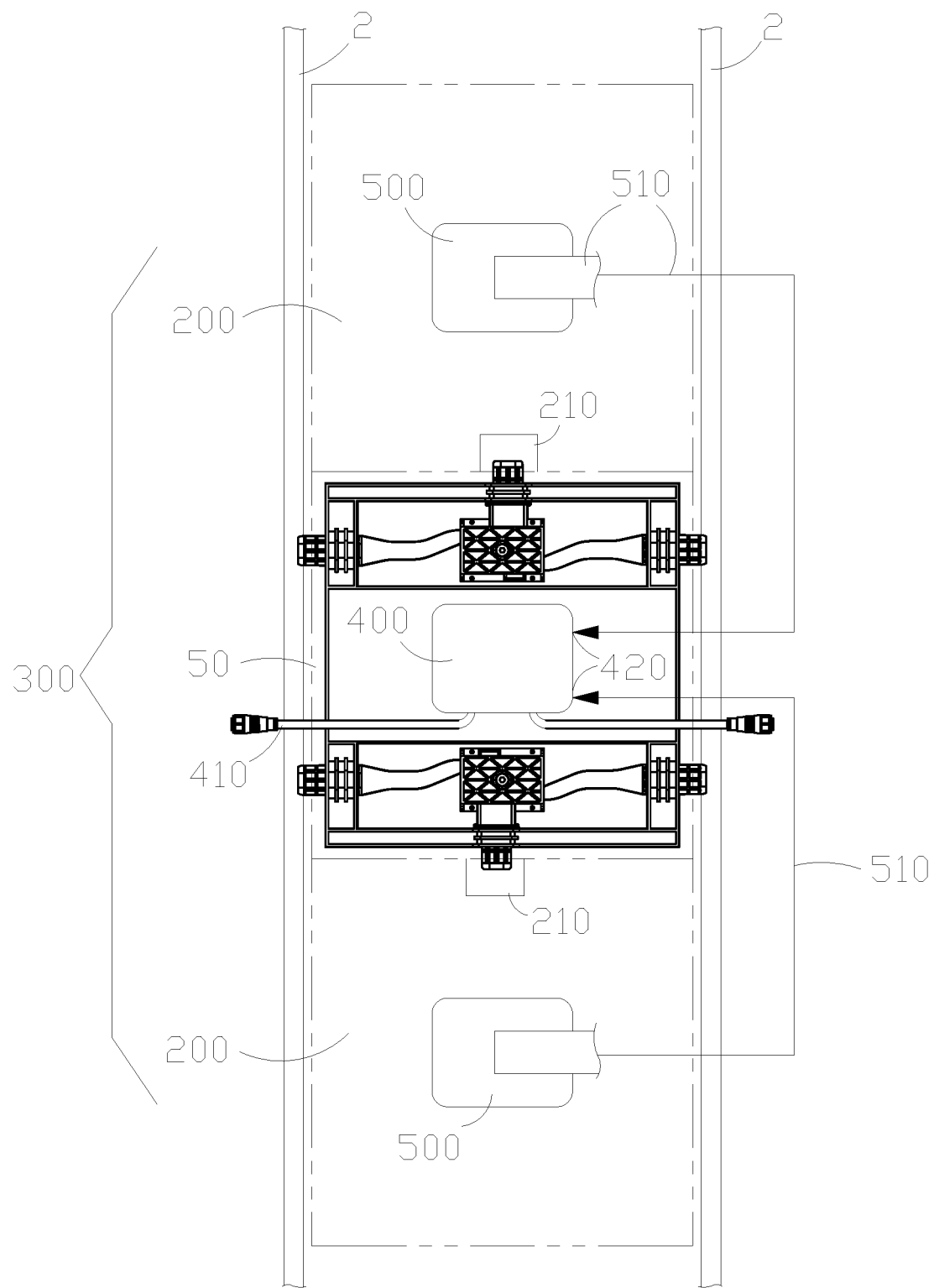
FIG. 6 illustrates the unit module of the present invention.

As shown in FIGS. 4 and 6, the linkage lock unit 100 includes a driving head 110 and three linking rods 120. Wherein, two of which are frame lock rods 130 and one of which is module lock rod 140.

The two frame lock rods 130 is used to lock the LED display module 50 on the assembly frame, while the module lock rod 140 is used to lock different LED display modules.

As shown in FIG. 6, the LED display module 50 is provided with sub-modules 200 on the upside and underside. One LED display module 50 can be assembled with two said sub-modules 200 to form a unit module 300. Two linkage lock units 100 are respectively arranged on the upside and underside of the LED display module 50.

In practice, an integral LED display screen can be directly formed by assembling multiply of the said unit modules. Because the unit module 300 is more large than one single LED display module 50, the assembling efficiency can be greatly improved by the said unit module 300.

The sub-modules 200 is provided with a connecting part 210 on the side edge. The connecting part 210 can be a clamp groove, a clamp hole or the like.

The rotation of the driving head 110 can drive the two frame lock rods 130 and one module lock rod 140 to project outwardly. Wherein, the two frame lock rods 130 are clamped in the assembly frame 2, while the module lock rod 140 is clamped in the connecting part 210 of the sub-module 200.

Because the location connection of the LED display module 50 and the two sub-modules 200 and the clamping of the unit module 300 and the assembly frame 2 can be operated simultaneously, the installation and disassembly are simple.

As shown in FIG. 6, a unit central control box 400 is arranged on the back of the LED display module 50. A sub-module central control box 500 is arranged on the back of the sub-module 200. The unit central control box 400 includes a unit leading-out wire 410 and a connecting socket 420.

The sub-module central control box 500 includes connecting wire 510 for the connection of the modules.

One end of the connecting wire 510 is connected to the box 500, the other end is connected to the connecting socket 420 of the box 400, therefore, the power connection and signal connection between the LED display module 50 and the two sub-modules 200 can be realized.

The unit leading-out wire 410 of the unit central control box 400 is connected to the adjacent unit module 300, so that the power connection and signal connection among the different unit modules 300 can be realized.

In practice, the unit leading-out wire 410 and the connecting wire 510 are both power and signal connecting wires. The box 400 and box 500 are provided with a transformer and a control IC.

By the connecting manner of power and signal said above, the present invention can simplify the connecting of the modules and facilitate the installation, and simplify the circuitry.

What is claimed is:

1. A linkage modularized LED display module (50), comprising: a LED lamp plate (10), a face guard board (20) and a bottom shell plate (30), wherein the LED lamp plate (10) is provided with multiple LED light sources (11), the face guard board (20) covers one side of the LED lamp plate (10) while the bottom shell plate (30) covers the other side of the lamp plate (10), and the multiple LED light sources (11) are exposed from the face guard board (20), the linkage modularized LED display module (50) comprises a linkage lock unit (100) which is provided on a back of the bottom shell plate (30), the linkage lock unit (100) comprises multiple linking rods (120) and driving head (110) which is rotatably inserted into the bottom shell plate (30), the driving head (110) comprises a rotating shaft (111), a gear column (112) which synchronously rotates with the rotating shaft (111) and a driving hole (113) which is provided in the gear column (112), the rotating shaft (111) is connected to the bottom of the gear column (112), the multiple linking rods (120) are engaged with the gear column (112), wherein each of the linking rods (120) comprises a rack (121), a connecting rod (122) and a chuck (123), the rack (121), the connecting rod (122) and the chuck (123) are connected together and form an integral structure, wherein the rack (121) is engaged with the gear column (112), the connecting rod (122) connects the rack (121) and the chuck (123), and the chuck (123) is located on edges of the bottom shell plate (30), wherein in operation, an operator inserts a column spanner into the driving hole (113) and rotates it, then the driving head (110) drives the multiple linking rods to work simultaneously and makes every of the chucks (123) project outwardly, thus the LED display module (50) is clamped in an assembly frame (2) or different LED modules are assembled together, wherein the linkage lock unit (100) comprises a driving head (110) and four linking rods (120), wherein the chucks (123) of the four linking rods (120) are respectively located at the four corners of the bottom shell plate (30), a rotation of the driving head (110) makes the four chucks (123) project outwardly, so the LED display module (50) clamped in the assembly frame (2).

2. A linkage modularized LED display module comprising: a LED lamp plate (10), a face guard board (20) and a bottom shell plate (30), wherein the LED lamp plate (10) is provided with multiple LED light sources (11), the face guard board (20) covers one side of the LED lamp plate (10) while the bottom shell plate (30) covers the other side of the lamp plate (10), and the multiple LED light sources (11) are exposed from the face guard board (20), the linkage modularized LED display module (50) comprises a linkage lock unit (100) which is provided on a back of the bottom shell plate (30), the linkage lock unit (100) comprises multiple linking rods (120) and a driving head (110) which is rotatably inserted into the bottom shell plate (30), the driving head (110) comprises a rotating shaft (111), a gear column (112) which synchronously rotates with the rotating shaft (111) and a driving hole (113) which is provided in the gear column (112), the rotating shaft (111) is connected to the bottom of the gear column (112), the multiple linking rods (120) are engaged with the gear column (112), wherein each of the linking rods (120) comprises a rack (121), a connecting rod (122) and a chuck (123), the rack (121), the connecting rod (122) and the chuck (123) are connected together and form an integral structure, wherein the rack (121) is engaged with the gear column (112), the connecting rod (122) connects the rack (121) and the chuck (123), and the chuck (123) is located on edges of the bottom shell plate (30), wherein in operation, an operator inserts a column spanner into the driving hole (113) and rotates it, then the driving head (110) drives the multiple linking rods to work simultaneously and makes every of the chucks (123) project outwardly, thus the LED display module (50) is clamped in an assembly frame (2) or different LED modules are assembled together, wherein the linkage lock unit (100) comprises a driving head (110) and three linking rods (120), two of which are frame lock rods (130) and one of which is module lock rod (140), the two frame lock rods (130) are used to lock the LED display module (30) on the assembly frame, while the module lock rod (140) is used to lock to different LED display modules, the LED display module (50) is provided with sub-modules (200) on the upside and underside, one said LED display module (50) is assembled with two said sub-modules (200) to form a unit module (300), two linkage lock units (100) are respectively arranged on the upside and underside of the LED display module (50), the sub-modules (200) are provided with a connecting part (210) on the side edge, the rotation of the driving head (110) drives the two frame lock rods (130) and the module lock rod (140) to project outwardly, then the two frame lock rods (130) are clamped in the assembly frame (2), while the module lock rod (140) is clamped in the connecting part (210) of the sub-module (200), the connection of the LED display module (50) and the two sub-modules (200) and the clamping of the unit module (300) and the assembly frame (2) are operated simultaneously.

3. The linkage modularized LED display module according to claim 2, wherein a unit central control box (400) is arranged on the back of the LED display module (50), a sub-module central control box (500) is arranged on the back of the sub-module (200), the unit central control box (400) comprises a unit leading-out wire (410) and a connecting socket (420), the sub-module central control box (500) comprises connecting wire (510) for the connection of the modules, one end of the connecting wire (510) is connected to the sub-module central control box (500), the other end is connected to the connecting socket (420) of the unit central control box (400), therefore, the power connection and signal connection between the LED display module (50) and the two sub-modules (200) is realized, the unit leading-out wire (410) of the unit central control box (400) is connected to the adjacent unit module (300), so that the power connection and the signal connection among the different unit modules (300) are realized.

4. The linkage modularized LED display module according to claim 2, wherein the connecting part (210) is a clamping groove.

5. The linkage modularized LED display module according to claim 2, wherein the connecting part (210) is a clamping hole.

6. A linkage modularized LED display module comprising: a LED lamp plate (10), a face guard board (20) and a bottom shell plate (30), wherein the LED lamp plate (10) is provided with multiple LED light sources (11), the face guard board (20) covers one side of the LED lamp plate (10) while the bottom shell plate (30) covers the other side of the lamp plate (10), and the multiple LED light sources (11) are exposed from the lace guard board (20), the linkage modularized LED display module (50) comprises a linkage lock unit (100) which is provided on a back of the bottom shell plate (30), the linkage lock unit (100) comprises multiple linking rods (120) and a driving head (110) which is rotatably inserted into the bottom shell plate (30), the driving head (110) comprises a rotating shaft (111), a gear column (112) which synchronously rotates with the rotating shaft (111) and a driving hole (113) which is provided in the gear column (112), the rotating shaft (111) is connected to the bottom of the gear column (112), the multiple linking rods (120) are engaged with the gear column (112), wherein each of the linking rods (120) comprises a rack (121), a connecting rod (122) and a chuck (123), the rack (121), the connecting rod (122) and the chuck (123) are connected together and form an integral structure, wherein the rack (121) is engaged with the gear column (112), the connecting rod (122) connects the rack (121) and the chuck (123), and the chuck (123) is located on edges of the bottom shell plate (30), wherein in operation, an operator inserts a column spanner into the driving hole (113) and rotates it, then the driving head (110) drives the multiple linking rods to work simultaneously and makes every of the chucks (123) project outwardly, thus the LED display module (50) is clamped in an assembly frame (2) or different LED modules are assembled together, wherein a radiating board (40) is embedded in the bottom shell plate (30), the bottom shell plate (30) is provided with an inside heat conducting hole (31) and an outside radiating hole (32), wherein the inside heat conducting hole (31) is positioned between the LED lamp plate (10) and the radiating board (40) and filled with heat conducting rubber block (33), and the outside radiating hole (32) communicates the radiating board (40) and the surrounding space (A).

7. The linkage modularized LED display module according to claim 6, wherein the bottom shell plate (30) is provided with a ring frame (41) connected with the radiating board (40), and the ring frame (41) and the radiating board (40) are made of metal.

8. The linkage modularized LED display module according to claim 6, wherein the heat conducting rubber block (33) is made of heat conducting silica gel.

* * * * *